(12) United States Patent
Hollinsworth et al.

(10) Patent No.: US 6,587,351 B2
(45) Date of Patent: Jul. 1, 2003

(54) SURFACE MOUNT STANDOFF FOR PRINTED CIRCUIT BOARD ASSEMBLY

(75) Inventors: Jeffrey Lynn Hollinsworth, Ballwin, MO (US); Randy John Bicknese, St. Peters, MO (US); Varinder Kumar Kalra, Chesterfield, MO (US); Keith Allen Spalding, Fenton, MO (US)

(73) Assignee: Cooper Technologies, Houston, TX (US)

( * ) Notice: Subject to any disclaimer, the term of this patent is extended or adjusted under 35 U.S.C. 154(b) by 0 days.

(21) Appl. No.: 10/114,830

(22) Filed: Apr. 2, 2002

(65) Prior Publication Data

US 2002/0145857 A1 Oct. 10, 2002

Related U.S. Application Data

(60) Provisional application No. 60/348,772, filed on Jan. 14, 2002, provisional application No. 60/317,290, filed on Sep. 5, 2001, and provisional application No. 60/281,797, filed on Apr. 5, 2001.

(51) Int. Cl.[7] .............................. H05K 1/14; H05K 1/18
(52) U.S. Cl. ...................... 361/758; 361/742; 361/770; 361/804
(58) Field of Search ............................... 361/752, 758, 361/770, 804, 742

(56) References Cited

U.S. PATENT DOCUMENTS

| | | | |
|---|---|---|---|
| 4,490,773 A | 12/1984 | Moffatt | |
| D278,143 S | 3/1985 | Hill | |
| D278,330 S | 4/1985 | Hill | |
| 5,155,664 A | * 10/1992 | Holterman et al. | 361/399 |
| 5,561,343 A | * 10/1996 | Lowe | 313/482 |
| D380,663 S | * 7/1997 | Nakamura | D8/354 |
| 5,675,212 A | * 10/1997 | Schmid et al. | 313/422 |
| 5,757,621 A | 5/1998 | Patel | |
| 5,786,989 A | * 7/1998 | Kawabe | 361/759 |
| 5,805,427 A | 9/1998 | Hoffman | |
| 5,825,633 A | * 10/1998 | Bujalski et al. | 361/804 |
| 5,963,432 A | 10/1999 | Crowley | |
| 5,999,405 A | 12/1999 | Zappacosta et al. | |
| 6,005,778 A | * 12/1999 | Spielberger et al. | 361/770 |
| 6,038,140 A | * 3/2000 | Petri | 361/804 |
| 6,084,781 A | 7/2000 | Klein | |
| 6,164,977 A | 12/2000 | Lester | |
| 6,259,032 B1 | * 7/2001 | Fernandez | 174/138 E |
| 6,278,066 B1 | * 8/2001 | Fahlen et al. | 174/250 |

* cited by examiner

*Primary Examiner*—David Martin
*Assistant Examiner*—Dameon E. Levi
(74) *Attorney, Agent, or Firm*—Armstrong Teasdale LLP

(57) ABSTRACT

A standoff for a printed circuit board assembly is described. The standoff comprises at least one surface configured for surface mounting to a printed circuit board.

5 Claims, 3 Drawing Sheets

SURFACE MOUNT STANDOFF FOR PRINTED CIRCUIT BOARD ASSEMBLY

CROSS REFERENCE TO RELATED APPLICATIONS

This application claims the benefit of U.S. Provisional Application Ser. No. 60/281,797 filed Apr. 5, 2001; U.S. application Ser. No. 60/317,290 filed Sep. 5, 2001; and U.S. Provisional Application No. 60/348,772 filed Jan. 14, 2002.

BACKGROUND OF THE INVENTION

This invention relates generally to printed circuit board assemblies, and, more particularly, to surface mount printed circuit board assemblies including standoffs.

With the recent proliferation of integrated circuit devices in a wide range of products, locating the integrated circuit devices with respect to an applicable printed circuit board has become a challenge. For space saving reasons, printed circuit boards are sometimes stacked upon one another. As the integrated circuit devices are connected to the printed circuit boards, the boards tend to flex, which can damage the conductive traces in a printed circuit board, damage electrical components on another printed circuit board, and produce undesirable electrical losses in the system. In some cases these effects can be alleviated by using known standoffs to add support to the printed circuit board assembly. Typically, the standoffs are substantially cylindrical and are attached to the printed circuit boards with a fastening member, such as resilient legs, springs, or screws via through-holes in a printed circuit board. Conventional standoffs, however, require some dexterity to properly install and therefore require hand installation, which increases costs of assembly and leads to some variation in product quality and reliability.

To simplify assembly and save further space, surface mount components are becoming increasingly popular. Surface mount components are soldered directly to the printed circuit board, and component leads and through-holes in the board may therefore be avoided. To avoid increased expense and difficulty of conventional standoffs in surface mount applications, surface mount components themselves, such as resistors, have been used solely to support the printed circuit boards and prevent excessive flexing of the board during connection of the integrated circuit devices. However, using non-functional components such as resistors for support purposes can significantly affect the cost of the printed circuit board assembly and increase the weight of the final assembly. Further, while plastic inserts have been used in lieu of nonfunctional surface mount components to support printed circuit board assemblies, they typically require through-holes in the board, are difficult to work with, and are inefficient from a manufacturing perspective.

BRIEF DESCRIPTION OF THE INVENTION

In one aspect, a standoff for a printed circuit board assembly is provided. The standoff comprises at least one surface configured for surface mounting to a printed circuit board.

In another aspect, a standoff for a printed circuit board including at least a first conductive trace pad and a second conductive trace pad for establishing a circuit to determine the presence of a number of standoffs if provided. The standoff comprises at least one surface having a dimension at least equal to a distance between the first and second conductive trace pads, said standoff at least partially conductive between said first and second trace pads.

In another aspect, a printed circuit board assembly is provided. The assembly comprises a first printed circuit board, a second printed circuit board, and at least one standoff in contact with each of said first and second printed circuit boards, said standoff surface mounted to at least one of said first and second printed circuit boards.

In another aspect, a method for determining the presence of a number of standoffs in a printed circuit board assembly is provided. The printed circuit board assembly includes at least one printed circuit board including conductive circuit traces having at least one pair of contact pads where each of the standoffs are to be located, and the conductive traces having at least a first termination and a second termination. The method comprises mounting the standoffs to the printed circuit board in electrical contact with respective pairs of contact pads, applying an electrical signal to said first trace termination, and detecting the presence or absence of the electrical signal at said second trace termination.

DETAILED DESCRIPTION OF THE INVENTION

Figure 1:
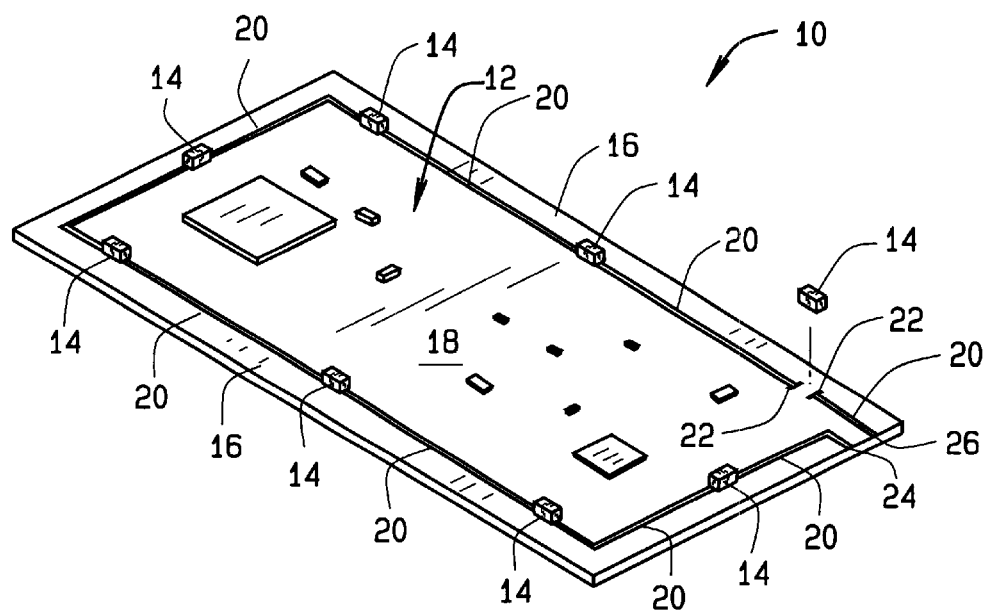
FIG. 1 is perspective view of a portion of a printed circuit board assembly.

FIG. 1 is a perspective view of an exemplary portion of a printed circuit board assembly 10 including a printed circuit board 12 having a number of surface mount electrical components mounted thereto by known processes and techniques. Printed circuit board 12 is further configured for connection to one or more integrated circuit (IC) devices known in the art, such as with a socket connection (not shown) or other known coupling mechanisms. Printed circuit board 12 includes a plurality of conductive paths or traces to establish electrical connections between the IC devices and the electrical components on printed circuit board 12. It is believed that those in the art of printed circuit boards and electronic packages could practice the present invention without a detailed description of printed circuit board 12 and applicable electronic components and IC devices used in conjunction with board 12. Further, it is recognized that the benefits of the present invention are applicable to a wide variety of differently configured printed circuit boards beyond the illustrative embodiment shown in FIG. 1. The illustrative embodiments shown in the Figures and described herein are therefore set forth for illustrative purposes only rather than by way of limitation.

In an exemplary embodiment of the present invention, printed circuit board assembly 10 includes a plurality of standoffs 14 located about an outer perimeter 16 of printed circuit board 12 to provide support for another printed circuit board (not shown in FIG. 1) that is stacked upon printed circuit board 12 after desired electrical components and IC devices have been mounted to board 12. In the illustrated embodiment, standoffs 14 are substantially rectangular blocks mounted to a flat surface 18 of printed circuit board 12 according to known processes and techniques. Standoffs 14 are appropriately sized and dimensioned to support another printed circuit board above the electrical components and IC devices affixed to surface 18 of printed circuit board 12. Damage to the electrical components and IC devices on printed circuit board 12 due to flexing of the circuit board as IC devices and electrical components are installed is therefore avoided. Further, surface mounting of standoffs 14 eliminates difficult through-hole mounting of standoffs 14 and facilitates automated installation of standoffs 14.

In the illustrated embodiment, eight standoffs 14 are provided on printed circuit board 12 in approximately an equally spaced relationship to one another about an outer perimeter 16 of printed circuit board 12. However, in alternative embodiments, greater or fewer than eight standoffs 14 are employed to provide adequate support to printed circuit board assembly 10. Further, while in the illustrated embodiment standoffs 14 are located about outer perimeter 16 of printed circuit board 12, standoffs could be located elsewhere, i.e., interior to outer perimeter 16 on printed circuit board 12 to provide increased stiffness and bending strength to printed circuit board 12.

In a further embodiment, standoffs 14 are conductive and are electrically connected to one another via conductive traces 20 formed on printed circuit board outer perimeter 16. In such an embodiment, standoffs 14 provide electrical connection between pads 22 located on respective ends of conductive traces 20 when standoffs 14 are mounted to board 12 with known soldering techniques. As such, when first and second terminations 24, 26, respectively, of conductive traces are connected to an electrical circuit, the presence or absence of the desired number of standoffs 14 may be detected by the presence or absence of an electrical signal output at conductive trace terminations 24, 26. Thus, it can be ensured that printed circuit board 12 is adequately supported with standoffs 14, and associated quality control issues and reliability concerns due to missing or damaged standoffs 14 is minimized. This is especially advantageous when large numbers of standoffs 14 are employed, such as in at least one application where 144 standoffs 14 are employed on a circuit board approximately 1.0 ft by 1.5 ft in dimension.

In one embodiment, conductive traces 20 for standoffs 14 form a stand-alone or independent circuit from circuitry in printed circuit board 12 between electrical components and IC devices thereon. In an alternative embodiment, traces 20 may be part of the functional circuitry of the printed circuit board and establish electrical connections between desired electrical components and IC devices.

Figure 2:
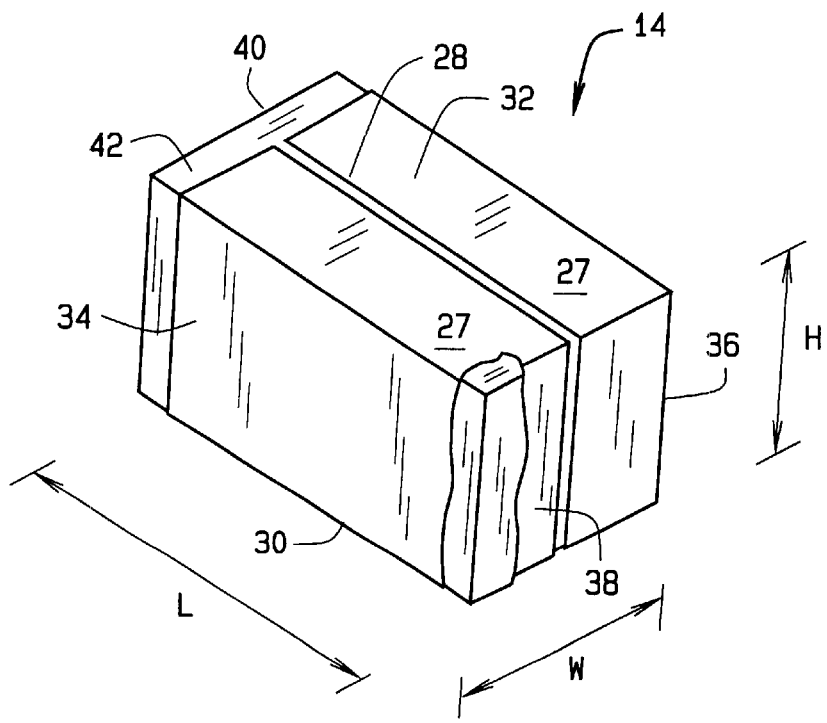
FIG. 2 is a perspective view of a standoff for the printed circuit board assembly shown in FIG. 1.

FIG. 2 is a perspective view of one exemplary standoff 14 for use in printed circuit board assembly 10 (shown in FIG. 1) wherein standoff 14 is fabricated from outer layers of insulative material 27 with a known conductive material 28 sandwiched therebetween. In an exemplary embodiment, insulative material 27 is a low cost epoxy glass material known in the art, while in alternative embodiments other known insulative materials including but not limited to plastic materials and ceramic materials are employed in lieu of epoxy glass materials.

Further, in an exemplary embodiment, conductive material 28 is a sheet of copper, copper alloy, zinc alloy, brass, or other known conductive alloys and materials familiar to those in the art. Insulative materials 27 and conductive material 28 may be assembled in large sheets and cut and adhered to one another using known techniques, such as, for example, with a known lamination process. Once assembled, the adhered sheets are subsequently diced, cut or otherwise separated into discrete standoffs 14. As such, a large number of standoffs 14 may be fabricated from low cost, widely available materials in a cost effective manner.

Once formed, standoffs 14 are substantially rectangular in an exemplary embodiment with six substantially flat faces orthogonally positioned with respect to one another. More specifically, standoff 14 includes a bottom face or bottom surface 30 for mounting to a printed circuit board, such as printed circuit board 12 (shown in FIG. 1), an oppositely disposed top face or top surface 32 for supporting another circuit board and extending substantially parallel to bottom face surface 30, two opposite side faces or side surfaces 34, 36 extending parallel to one another and generally perpendicular to top and bottom surfaces 30 and 32, and two end faces or end surfaces 38, 40 extending parallel to one another and substantially perpendicular to the remainder of surfaces 30, 32, 34, 36.

Conductive material 28 is exposed on bottom surface 30, top surface 32, and end surfaces 38, 40 for establishing electrical connection through standoff 14. In the illustrated embodiment, conductive material 28 extends end-to-end on each respective face surface, i.e. extends fully between opposite edges of the surfaces of standoff 14. It is recognized that in alternative embodiments conductive material 28 need not extend end-to-end, but rather may extend only partially between respective edges of the faces and surfaces of standoff 14. For example, in an alternative embodiment conductive material 28 may be a conductive strip having a length less than L and a height approximately equal to H such that conductive material 28 is exposed on bottom surface 30 and top surface 32 but not on end surfaces 38, 40, provided, of course, that L is sufficiently long such that conductive material 28 contacts circuit traces 20 and extends between circuit trace terminations 22 (shown in FIG. 1).

In an exemplary embodiment, standoffs 14 are dimensioned to have height H of approximately 0.070 inches and are cut with an appropriate length L and width W to form a stable structure that will not topple over during soldering operations. For example, in one exemplary embodiment, dimensions for W and L are about 0.070 inches and 0.126 inches, respectively. It is recognized that dimensions of standoff 14 may be selected that are greater or lesser than the illustrative dimensions provided above to accommodate differently dimensioned electrical components and IC devices for a selected application.

In the illustrated embodiment, insulation material 27 is of two substantially symmetrical halves about conductive material 28. In other words, insulation material 27 is of approximately the same thickness on either side of conductive material 28. It is contemplated, however, that in alternative embodiments, relative thicknesses of insulative material 27 need not be approximately equal to achieve the benefits of the present invention.

It is further noted that in alternative embodiments, surfaces 34, 36, 38 and 40 need not be parallel or perpendicular to one another so long as bottom face surface 30 may be adequately mounted to a printed circuit board, and further so long as top surface 32 adequately supports another printed circuit board. Thus, it is apparent that standoff 14 may include greater or fewer than six sides in an alternative embodiment, including one or more curved side surfaces, while obtaining the benefits of the present invention. In addition, opposed sides, e.g., bottom surface 30 and top surface 32, need not be equally dimensioned to achieve the stability benefits of the invention. Further, for example, cylindrical standoffs may be employed in alternative embodiments while realizing the advantages of the instant invention. Thus, for example, extruded plastic tubing or tubing fabricated from a known polymer material (conductive or non-conductive) may be cut to length with metallized ends or surfaces by plating, dipping or other known metallization techniques without departing from the scope of the present invention.

In a further embodiment, one or more of surfaces 30, 32, 34, 36, 38, and 40 are electroplated or coated with an electrically conductive material for improved electrical connections to conductive traces 20 (shown in FIG. 1). In one embodiment, for example, end surfaces 38 and 40 each include a conductive overlay 42 (partially shown on end face surface 38) such as a copper clad epoxy material or other known conductive alloy. As such, standoff 14 may be oriented with any of top, bottom, and side surfaces 30, 32, 34, and 36 face-down for mounting to printed circuit board 12 (shown in FIG. 1) while still establishing a current path through standoff conductive material 28 between circuit trace contact pads 22 (shown in FIG. 1). It is appreciated, however that a conductive path through conductive material 28 may be established by metallizing only one face of standoff 14, such as for example, bottom face surface 30 or top face surface 32 with conductive overlay 42, although specific orientation of the metallized standoff faces relative to printed circuit board 12 is required in such an application.

In still a further embodiment, in lieu of electroplated or coated overlay 42, selective standoff 14 surfaces, such as end face surfaces 38, 40, are metallized with a conductive overlay by dipping standoffs 14 in a conductive paste, such as a silver based paste and the like. Therefore, when end face surfaces 38, 40 are adjoined to contact pads 22 (shown in FIG. 1) of conductive traces 20 (also shown in FIG. 1), an electrical circuit is facilitated through standoffs 14 via metallized end surfaces 38, 40 and conductive material 28 therebetween. An electrical circuit is therefore completed between conductive trace terminations 24, 26 (shown in FIG. 1) when all standoffs 14 are present and installed on printed circuit board 12 (shown in FIG. 1).

In various embodiments, known attachment processes are employed to facilitate electrical contact between standoffs 14 and conductive traces 20. For example, castellation processes may be employed on standoff ends 38, 40, solder ball techniques may be applied on standoff bottom surface 30, and other known techniques may be employed as those in the art will appreciate.

In further embodiments, metallization of standoff 14 surfaces, such as with conductive overlay 42, facilitates electrical connection between different circuit boards through standoffs 14 as well as between circuit trace contact pads 22 of one circuit board 12. For example, when end surfaces 38, 40 each include conductive overlay 42, an electrical circuit may be completed between first and second printed circuit boards through standoff 14 conductive material 28 and or conductive overlay 42 when standoff 14 is coupled to contact pads 22 of conductive traces 20 (shown in FIG. 1) of different circuit boards. Thus, by metallizing standoff 14 end face surfaces 38, 40, a circuit may be established through different circuit boards via standoff 14 regardless of a particular face-down orientation of standoff 14 to printed circuit board 12.

In various alternative embodiments, different combinations of surfaces 30, 32, 34, 36, 38 and 40 may include conductive overlay 42 to accomplish electrical connections to various boards, circuits, electrical components, or IC devices as desired. Further, it is recognized that establishing circuits between different circuit boards could be accomplished without metallization of standoff 14 surfaces, although specific positioning of standoff 14 conductive material 28 relative to the printed circuit boards would be required.

While the above-described and illustrated standoff 14 conductive material 28, conductive overlay 42 and conductive traces 20 are believed to be beneficial and advantageous, it is recognized that the invention may be practiced in an alternative embodiment without conductive overlay 42 and conductive traces 20. As such, other inspection techniques to detect the presence and proper positioning of standoffs 14, including but not limited to visual inspection, may be employed for increased quality control and product reliability.

The above-described standoff 14 also facilitates automated assembly of printed circuit board assemblies 10, and therefore avoids tedious manual insertion of known standoffs including fastening members and through-holes in a printed circuit board. Once formed, standoffs 14 may be installed on a printed circuit board with standard machinery. For example, standoffs 14 may be placed on known tape (e.g., conventional 8 mm, 12 mm, 16 mm, 22 mm, or otherwise appropriately dimensioned tape), for removal by known machinery for proper placement onto the printed circuit board. Once in place, standoffs 14 are then soldered to contact pads 22 using known techniques, and a robot may then be employed to insert IC devices into appropriate sockets in the board. Standoffs 14 provide strength and stiffness to resist excessive flexing of the board during insertion of the IC's.

Figure 3:
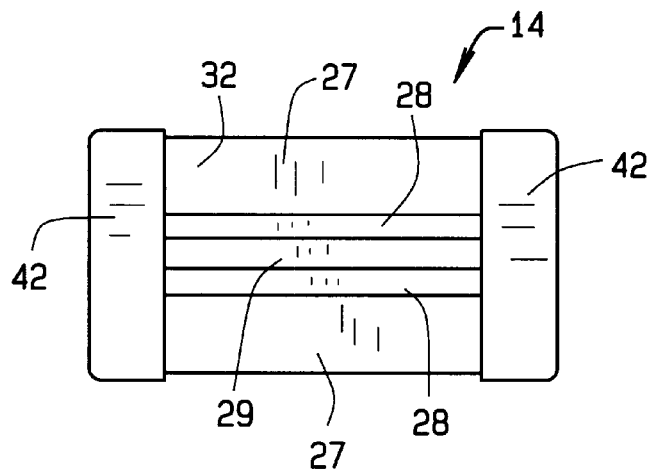
FIG. 3 is a top plan view of the standoff shown in FIG. 2.

FIG. 3 is a top plan view of standoff 14 illustrating an exemplary, albeit exaggerated, construction of thereof. In an illustrative embodiment, first and second strip of conductive material 28 are joined together with a known adhesive 29, and insulating material 27 is located on either side of joined strips of conductive material 28. Conductive overlay 42 is applied to stand off end surfaces 38, 40 (shown in FIG. 1) and adjacent regions of standoff 14 top surface 32 and bottom surface 30.

In one embodiment, insulating material 27 is a known material used for manufacturing printed board, including but not limited to FR-4 board or FR-370 board familiar to those in the art. Conductive material 28 is, for example, a 0.0014 inch thick copper strip, and copper strips 28 are joined with a known adhesive at an approximate thickness of about 0.013 inches. Standoff 14 end surfaces 38, 40 are dipped in a conductive paste, such as a silver based paste and the like and fired in an oven to provide overlay 42 on respective ends of standoff 14. The outer surfaces of standoff 14 are then flashed with nickel to form a nickel plating of about 200 to about 400 microinch thickness, and the nickel flash is overplated with a tin-lead plating to a thickness of about 300 to about 600 microinches, Overlay 42 effectively forms metallized termination surfaces on standoff 14.

While the illustrated construction in FIG. 3 essentially includes five layers (two layers 27, two layers 28 and one layer 29) to form standoff 14, it is understood that greater or fewer layers, such as three layers for example, may be employed to manufacture standoff 14.

Figure 4:
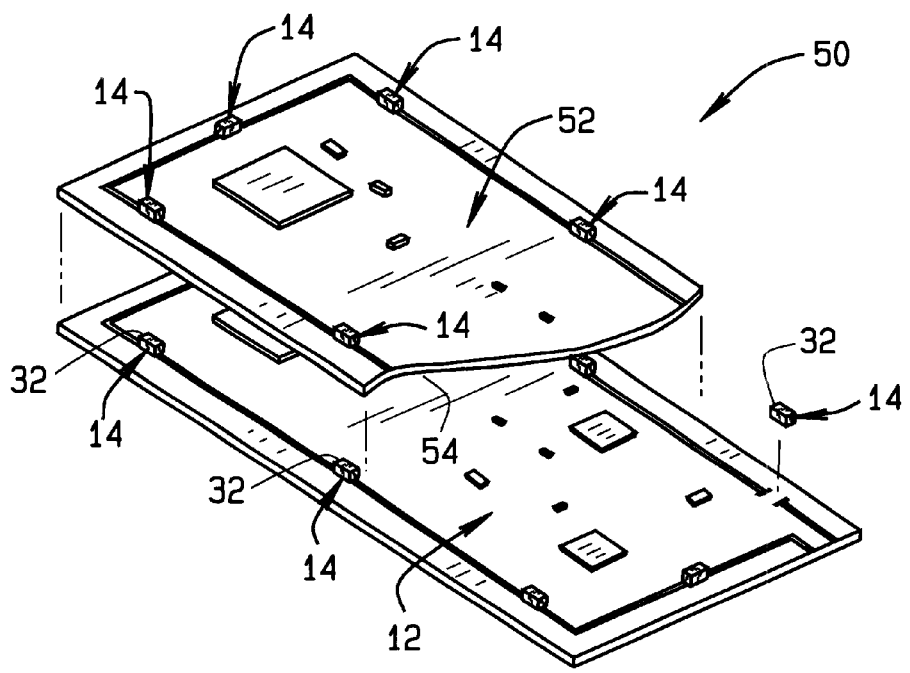
FIG. 4 is an exploded view of a printed circuit board assembly.

FIG. 4 is an exploded view of a printed circuit board assembly 50 wherein like components of circuit board assembly 10 (shown in FIG. 1) are indicated with like reference characters. As illustrated in FIG. 4, a second printed circuit board 52, similar in construction to printed circuit board 12 (described above) is stacked upon printed circuit board 12 so that a bottom surface 54 of second printed circuit board 52 rests upon top surfaces 32 of standoffs 14. As such, flexing of second printed circuit board 52 is decreased when IC devices are inserted thereon, and associated electrical losses, damage to conductive traces on printed circuit board 12 and damage to electrical components on the printed circuit boards is minimized. Because standoffs 14 are also included on second printed circuit board 52, a third printed circuit board (not shown) may be stacked upon printed circuit board assembly 50, and even more boards may be similarly added while reducing flexure of the assembly during manufacturing operations.

For all the above reasons, a more versatile, more cost effective and more reliable printed circuit board assembly is provided relative to conventional circuit board assemblies.

Figure 5:
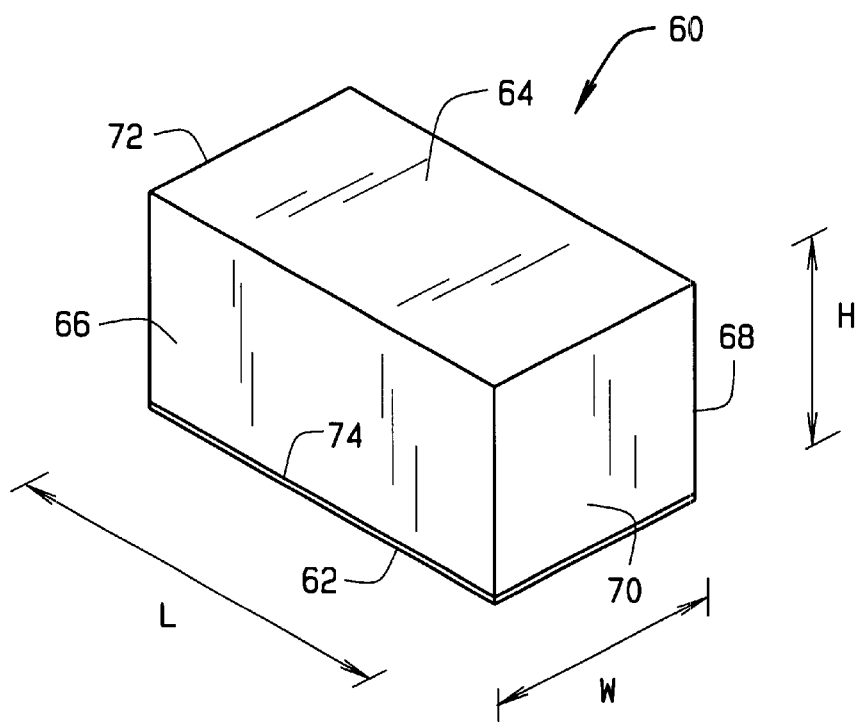
FIG. 5 is a perspective view of a second embodiment of a standoff.

FIG. 5 is a perspective view of a second embodiment of a standoff 60 for use with, for example printed circuit board assembly 10 (shown in FIG. 1) and printed circuit board 52 (shown in FIG. 4) in lieu of standoff 14 (shown in FIGS. 1–4).

Standoff 60, unlike standoff 14 that is formed partly from an insulative material, is fabricated wholly from a known conductive material, such as, for example, a sheet of zinc alloy that is diced, cut, sawed, or otherwise separated into a plurality of discrete standoffs 60. As such, a large number of standoffs 60 may be fabricated from a single sheet of conductive material in a cost effective manner. It is recognized, however, that standoffs 60 may be formed from other known available conductive materials in lieu of zinc alloys in alternative embodiments, including but not limited to copper, brass, and other known conductive alloys and materials. It is further contemplated that other fabrication processes may be employed to form standoffs 60, including but not limited to extrusion processes, stamping processes, powder metallurgy processes, injection molding processes, winding processes and pressing processes familiar to those in the art.

Once formed, standoffs 60 are substantially rectangular in an exemplary embodiment with six substantially flat faces or surfaces orthogonally positioned with respect to one another. More specifically, standoff 60 includes a bottom surface 62 for mounting to a printed circuit board, such as printed circuit board 12 (shown in FIG. 1), an oppositely disposed top surface 64 for supporting another circuit board and extending substantially parallel to bottom surface 62, two opposite side surfaces 66, 68 extending parallel to one another and generally perpendicular to top and bottom surfaces 62 and 64, and two end surfaces 70, 72 extending parallel to one another and substantially perpendicular to the remainder of surfaces 62, 64, 66, 68.

In an exemplary embodiment, standoffs 60 are formed from a sheet of conductive material having a thickness of approximately 0.070 inches, so that each standoff 60 has a corresponding height H of approximately 0.070 inches. Standoffs 60 are cut with an appropriate length L and width W to form a stable structure that will not topple over during soldering operations. For example, in one exemplary embodiment, dimensions for W and L are 0.070 inches and 0.126 inches, respectively. It is recognized that dimensions of standoff 60 may be selected that are greater or lesser than the illustrative dimensions provided above to accommodate differently dimensioned electrical components and IC devices for a selected application. Further, length L and width W dimensions need not be equal in alternative embodiments.

It is further noted that in alternative embodiments, surfaces 66, 68, 70, and 72 need not be parallel or perpendicular to one another so long as bottom surface 62 may be adequately mounted to a printed circuit board, and further so long as top surface 64 adequately supports another printed circuit board. Thus, it is apparent that standoff 60 may include greater or fewer than six sides in an alternative embodiment, including one or more curved side surfaces, while obtaining the benefits of the present invention. In addition, opposed sides, e.g., bottom surface 62 and top surface 64, need not be equally dimensioned, and standoff 60 could be hollow between bottom surface 62 and top surface 64 while still achieving the stability benefits of the invention. Also, the foregoing fabrication processes may be employed to produce standoffs 60 of varying shapes. Thus, for example, a hollow standoff tube may be formed by an extrusion process or, as another example, a conductive standoff tube could be formed by winding a conductive element about a mandrel without departing from the scope of the present invention.

In a further embodiment, surfaces 62, 64, 66, 68, 70 and 72 are electroplated or coated with an electrically conductive material for improved electrical connections to conductive traces 20 (shown in FIG. 1). In one embodiment, for example, standoffs 60 are formed from a copper plated material so that bottom surface 62 includes a conductive overlay 74. Other known conductive mediums, such as a copper clad epoxy material or conductive alloys could be employed in an alternative embodiment to form a conductive overlay on bottom surface 62. In still a further embodiment, standoffs 60 are metallized with a conductive layer by dipping standoffs 60 in a conductive paste, such as a silver based paste and the like. Therefore, when conductive overlay 74 on bottom surface 62 is adjoined to contact pads 22 (shown in FIG. 1) of conductive traces 20 (also shown in FIG. 1), an electrical circuit is facilitated between conductive trace terminations 24, 26 (shown in FIG. 1) when all standoffs 60 are present.

In alternative embodiments, more than one of surfaces 62, 64, 66, 68, 70 and 72 include a conductive layer 74 to facilitate mounting to printed circuit board 12 (shown in FIG. 1) or to complete an electrical connection between different circuit boards. For example, when bottom surface 62, top surface 64, and one of end surfaces 70, 72 each include conductive layer 74, an electrical circuit may be completed between first and second printed circuit boards when each of bottom and top surfaces 62, 64 are coupled to contact pads 22 of conductive traces 20 (shown in FIG. 1) of different circuit boards. Different combinations of sides 62, 64, 66, 68, 70 and 72 may include conductive layer 74 to accomplish electrical connections to various boards, circuits, electrical components, or IC devices as desired.

While the above-described and illustrated conductive overlay 74 and conductive traces 20 are believed to be beneficial and advantageous, it is recognized that the invention may be practiced in an alternative embodiment without conductive layer 74 and/or conductive traces 20. In such an alternative embodiment, standoff 60 is not a conductive component and other inspection techniques to detect the presence and proper positioning of standoffs 60, including but not limited to visual inspection, may be employed for increased quality control and product reliability.

The above described standoff 60 also facilitates automated assembly of printed circuit board assemblies 10, and therefore avoids tedious manual insertion of known standoffs including fastening member and through-holes in a printed circuit board. Once formed, standoffs 60 may be installed on a printed circuit board with standard machinery. For example, standoffs 60 may be placed on known tape (e.g., conventional 8 mm, 12 mm, 16 mm, 22 mm, or otherwise appropriately dimensioned tape), for removal by known machinery for proper placement onto the printed circuit board. Standoffs 60 are then soldered to contact pads 22 using known techniques, and a robot may then be employed to insert IC devices into appropriate sockets in the board. Standoffs 60 provide strength and stiffness to resist excessive flexing of the board during insertion of the IC's.

Figure 6:
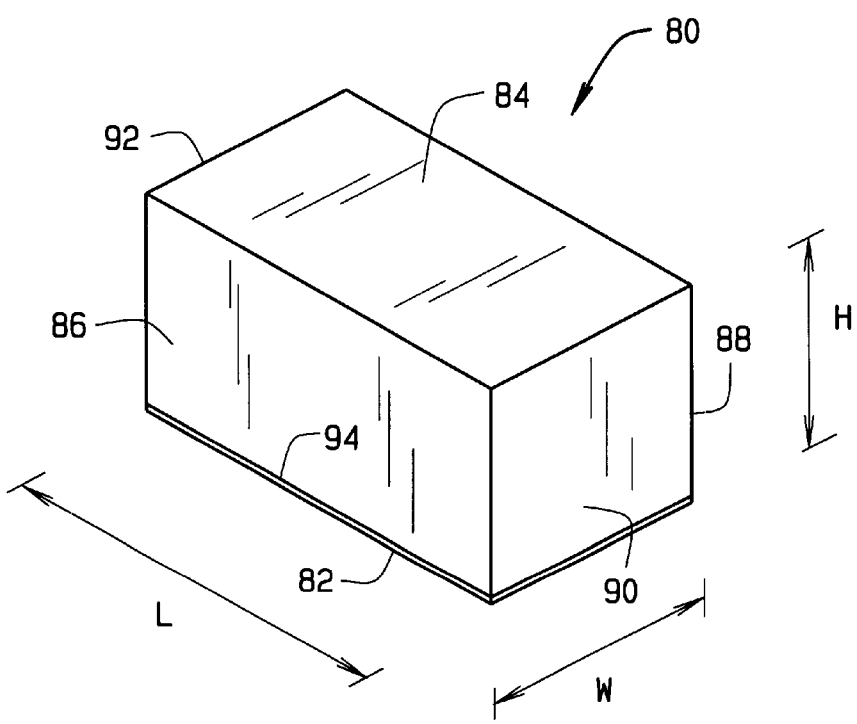
FIG. 6 is a perspective view of a third embodiment of a standoff.

FIG. 6 is a perspective view of a third embodiment of a standoff 80 for use in printed circuit board assembly 10 (shown in FIG. 1) in lieu of standoff 14 (shown in FIGS. 1–4) or standoff 60 (shown in FIG. 5).

Standoff 80 is formed from a known printed circuit board material (not shown), such as for example, FR-4 board that is diced, cut, sawed, or otherwise separated into a plurality of discrete standoffs 80. As such, a large number of standoffs 80 may be fabricated from a single sheet of printed circuit board material in a cost effective manner. It is recognized, however, that standoffs 80 may be formed from other known available materials in lieu of FR-4 board in alternative embodiments. Once formed, standoffs 80 are substantially rectangular with six substantially flat faces orthogonally positioned with respect to one another. More specifically, standoff 80 includes a bottom surface 82 for mounting to a printed circuit board, such as printed circuit board 12 (shown in FIG. 1), an oppositely disposed top surface 84 for supporting another circuit board and extending substantially parallel to bottom surface 82, two opposite side surfaces 86, 88 extending parallel to one another and generally perpendicular to top and bottom surfaces 82 and 84, and two end surfaces 90, 92 extending parallel to one another and substantially perpendicular to the remainder of surfaces 82, 84, 86, and 88.

In an exemplary embodiment, standoffs 80 are formed from FR-4 board having a thickness of approximately 0.072 inches, so that each standoff 80 has a corresponding height H of approximately 0.072 inches. Standoffs 80 are cut with an appropriate length L and width W to form a stable structure that will not topple over during soldering operations. For example, in different embodiments, dimensions for L and W are such that surfaces 82 and 84 are 3.2 mm by 1.6 mm, 1.6 mm by 0.8 mm, and 2.0 mm by 1.2 mm, respectively. In yet another alternative embodiment, standoffs 80 are formed from FR-4 board having a thickness of approximately 0.090 or 0.062 inches, so that each standoff 80 has a corresponding height H of approximately 0.090 inches or 0.062 inches, respectively, and length L and width W may be varied accordingly to produce a stable base for mounting to a printed circuit board, such as printed circuit board 12 (shown in FIG. 1). It is recognized that dimensions of standoff 80 may be selected to accommodate differently dimensioned electrical components and IC devices for a selected application.

It is further noted that in alternative embodiments, surfaces 82, 84, 86, and 88 need not be parallel or perpendicular to one another so long as bottom surface 82 may be adequately mounted to a printed circuit board, and further so long as top surface 84 adequately supports another printed circuit board. Thus, it is apparent that standoff 80 may include greater or fewer than six sides in an alternative embodiment, including one or more curved side surfaces, while obtaining the benefits of the present invention. In addition, opposed sides, e.g., bottom surface 82 and top surface 84, need not be equally dimensioned to achieve the stability benefits of the invention. Further, a variety of nonconductive materials may be employed to fabricate standoffs in a variety of shapes. For example, solid or hollow tubes fabricated from nonconductive material, such as plastic or known polymer materials, or wound paper tubing as another example, may be employed and used as standoffs with metallized ends for soldering to a printed circuit board.

As thus far described, standoff 80 is nonconductive but still advantageous for facilitating a surface mount standoff 80 from low cost materials that may be installed in an automated process while avoiding through-holes in printed circuit board 12 (shown in FIG. 1).

In a further embodiment, however, bottom surface 82 is coated with an electrically conductive material for establishing electrical connections to conductive traces 20 (shown in FIG. 1). In one embodiment, for example, standoffs 80 are formed from a copper plated material so that bottom surface 82 includes a conductive overlay 94. Other known conductive mediums, such as a copper clad epoxy material or conductive alloys could be employed in an alternative embodiment to form a conductive overlay on bottom surface 82. In still a further embodiment, standoffs 80 are fabricated from a ceramic or plastic material that is metallized by dipping in a conductive paste, such a silver based paste and the like. Therefore, when conductive layer 94 on bottom surface 82 is adjoined to contact pads 22 (shown in FIG. 1) of conductive traces 20 (also shown in FIG. 1), an electrical circuit may be completed between conductive trace terminations 24, 26 (shown in FIG. 1) when all standoffs 80 are present.

In alternative embodiments, more than one of surfaces 82, 84, 86 ,88, 90, and 92 include a conductive overlay 94 to facilitate mounting to printed circuit board 12 (shown in FIG. 1) or to complete an electrical connection between different circuit boards. For example, when bottom face 82, top face 84, and one of end surfaces 90, 92 each include conductive overlay 94, an electrical circuit may be completed between first and second printed circuit boards when each of bottom and top surfaces 82, 84 are coupled to contact pads 22 of conductive traces 20 (shown in FIG. 1) of different circuit boards. Different combinations of sides 82, 84, 86, 88, 90 and 92 may include conductive layer 94 to accomplish electrical connections to various boards, circuits, electrical components, or IC devices as desired.

While the above-described and illustrated conductive overlay 94 and conductive traces 20 are believed to be beneficial and advantageous, it is recognized that the invention may be practiced in an alternative embodiment without conductive overlay 94 and conductive traces 20. As such, other inspection techniques, including but not limited to visual inspection, may be employed for increased quality control and product reliability.

The above described standoff 80 also facilitates automated assembly of printed circuit board assemblies 10, and therefore avoids tedious manual insertion of known standoffs including fastening member and through-holes in a printed circuit board. Once formed, standoffs 80 may be installed on a printed circuit board with standard machinery. For example, standoffs 80 may be placed on known tape (e.g., conventional 8 mm, 12 mm, 16 mm, 22 mm, or otherwise appropriately dimensioned tape), for removal by known machinery for proper placement onto the printed circuit board. Standoffs 80 are then soldered to contact pads 22 using known techniques, and a robot may then be employed to insert IC devices into appropriate sockets in the board. Standoffs 80 provide strength and stiffness to resist excessive flexing of the board during insertion of the IC's.

It is recognized that standoffs 14 (shown in FIGS. 1–3), standoffs 60 (shown in FIG. 5) and standoffs 80 may be employed in combination in a printed circuit board assembly. That is, some standoffs 14 may be employed together with some standoffs 60 and some standoffs 80 in single PC Board assembly.

While the invention has been described in terms of various specific embodiments, those skilled in the art will recognize that the invention can be practiced with modification within the spirit and scope of the claims.

What is claimed is:

1. A standoff for a printed circuit board including at least a first conductive trace pad and a second conductive trace pad for establishing a circuit to determine the presence of a number of standoffs, said standoff comprising:

at least one surface having a dimension at least equal to a distance between the first and second conductive trace pads, said standoff at least partially conductive between said first and second trace pad, said at least one surface comprising a conductive overlay extending between the first and second trace pads.

2. A standoff in accordance with claim 1 wherein said standoff comprises a plurality of surfaces, at least one of said surfaces metallized.

3. A standoff in accordance with claim 1 wherein said standoff comprises a conductive element sandwiched between nonconductive elements.

4. A standoff in accordance with claim 1 wherein said standoff comprises a first end surface and a second end surface, at least one of said first and second end surfaces metallized.

5. A standoff in accordance with claim 4 wherein said standoff is substantially rectangular.

* * * * *